United States Patent [19]

Hess et al.

[11] Patent Number: 4,994,882

[45] Date of Patent: Feb. 19, 1991

[54] SEMICONDUCTOR DEVICE AND METHOD

[75] Inventors: Karl Hess, Urbana; James J. Coleman, Champaign; Ted K. Higman, Champaign; Mark A. Emanuel, Champaign, all of Ill.

[73] Assignee: University of Illinois, Urbana, Ill.

[21] Appl. No.: 309,908

[22] Filed: Feb. 10, 1989

Related U.S. Application Data

[63] Continuation of Ser. No. 927,554, Nov. 5, 1986, abandoned.

[51] Int. Cl.⁵ .................. H01L 29/74; H01L 29/80; H01L 29/161
[52] U.S. Cl. ........................... 357/38; 357/22; 357/16
[58] Field of Search .................. 357/16, 22 A, 38

[56] References Cited

U.S. PATENT DOCUMENTS

| | | | |
|---|---|---|---|
| 4,236,165 | 11/1980 | Kawashima et al. | 357/16 |
| 4,353,081 | 10/1982 | Allyn et al. | 357/16 |
| 4,450,463 | 5/1984 | Chin | 357/16 |
| 4,641,161 | 2/1987 | Kim et al. | 357/16 |
| 4,758,868 | 7/1988 | Frijunk | 357/16 |

FOREIGN PATENT DOCUMENTS 60-88464  5/1985  Japan ........................... 357/34 HB

OTHER PUBLICATIONS

Chow et al., "Negative Differential Resistances from $Hg_{1-x}Cd_x$ Te-CdTe Single Quantum Barrier Heterostructure", 3/31/86, pp. 1485-1487.

Hieblum et al., "Tunneling Hot-Electron Transfer Amplifiers A Hot-Electron GaAs Device with Current Gain", 8/29/85, pp. 1105-1107.

F. Capasso et al., "The Superlatice Photodetector ...", Proc. 1981, I.E.D.M., Dec. 1981, 81CH1708.7, pp. 284-287.

T. E. Bell, "The Quest for Ballisitic Action", IEEE Spectrum, Feb. 1986.

J. M. Poate et al., "Progress Toward a Metal-Base Transistor", IEEE Spectrum, Feb. 1985.

L. F. Eastman, "Ballistic Electrons in Compound Semiconductors", IEEE Spectrum, Feb. 1986.

M. I. Nathan et al., "A Gallium Arsenide Ballistic Transistor?", IEEE Spectrum, Feb. 1986.

Y. Zohta, "Negative Resistance of Semiconductor Heterojunction Diodes Owing to Transmission Resonance", J. Appl. Phys. 57(6), 1985.

Primary Examiner—Rolf Hille
Assistant Examiner—Wael Fahmy
Attorney, Agent, or Firm—Martin Novack (List continued on next page.)

[57] ABSTRACT

A semiconductor heterostructure device is disclosed which includes a first semiconductor layer having a barrier layer disposed thereon, the barrier layer being formed of a semiconductor material having a wider bandgap than the material of the first semiconductor layer. A carrier transport layer is disposed on the barrier layer, the carrier transport layer being formed of a semiconductor material having a narrower bandgap than the material of the barrier layer. A contact layer is disposed on the carrier transport layer. A negative potential is applied to the contact layer with respect to the first semiconductor layer. In operation, for small voltages, under the indicated bias configuration, electrons supplied to the carrier transport layer by the source of negative potential supply will be blocked at the barrier presented by the larger bandgap barrier layer, and little current will flow. As the bias voltage is increased, these blocked electrons are under the influence of an increasing electric field which raises the electron energy. At some point, these "heated" electrons will suddenly have enough energy to cross the barrier and contribute to a larger current flow. A transition can occur between these two types of current flow, and the result is an S-shaped type of current-voltage characteristic, which can be utilized to obtain a very fast dual state device.

27 Claims, 4 Drawing Sheets

OTHER PUBLICATIONS

T. Sollner et al., "Resonant Tunneling Through Quantum Wells at Frequencies up to 2.5 THz", Appl. Phys. Lett. 43(6), 1983.

T. Sollner et al., "Quantum Well Oscillators", Appl. Phys. Lett. 45(12), 1984.

S. W. Kirchoefer et al., "Negative Differential Resistance at 300K in a Superlattice Quantum State Transfer Device", Appl. Phys. Lett. 44(11), 1984.

A. Kastalsky et al., "High Frequency Amplification and Generation in Charge Injection Devices", Appl. Phys. Lett. 48(1), Jan. 1986.

M. Heiblum et al., "Tunneling Hot-Electron Transfer Amplifier: A Hot-Electron GaAs Device with Current Gain", Appl. Phys. Lett. 47(10), 1985.

J. R. Barker, "Quantum Theory of Hot Electron Tunneling in Microstructures", Physika 134B, 1985.

Hickmott et al., "Sequential Single-Phonon Emission in $GaAs-Al_xGa_{1-x}As$ Tunnel Junctions", Phys. Rev. Lett. 52(23), 1984.

T. Nakagawa et al., "Observation of Negative Differential Resistance in Chirp Superlattices", Electronic Letters, 21, Sep. 19, 1985.

D. H. Chow et al., "Negative Differential Resistances from $Hg_{1-x}Cd_xTe-CdTe$ Single Quantum Barrier Heterostructures", Appl. Phys. Lett. 48, May 21, 1986.

A. M. Belyantsev et al., "New Nonlinear High Frequency Effects and S-Shaped Negative Differential Conductivity in Multilayer Heterostructures", JETP Lett. 43, Apr. 7, 1986.

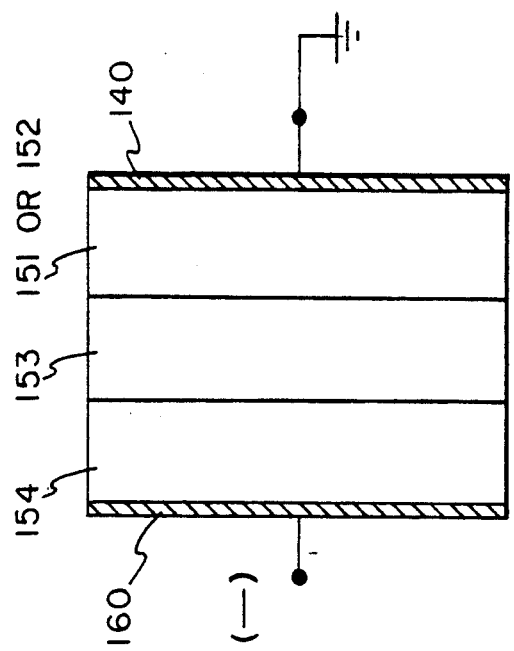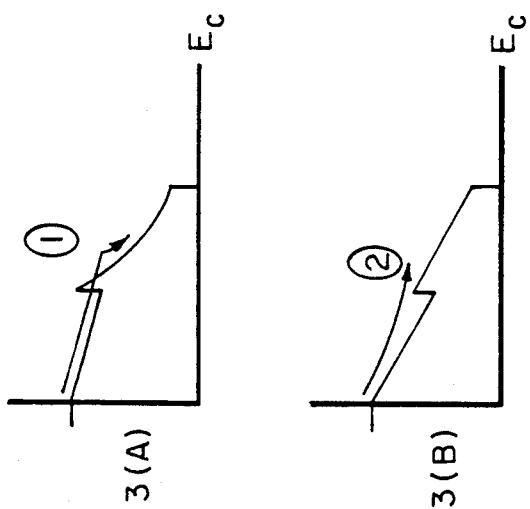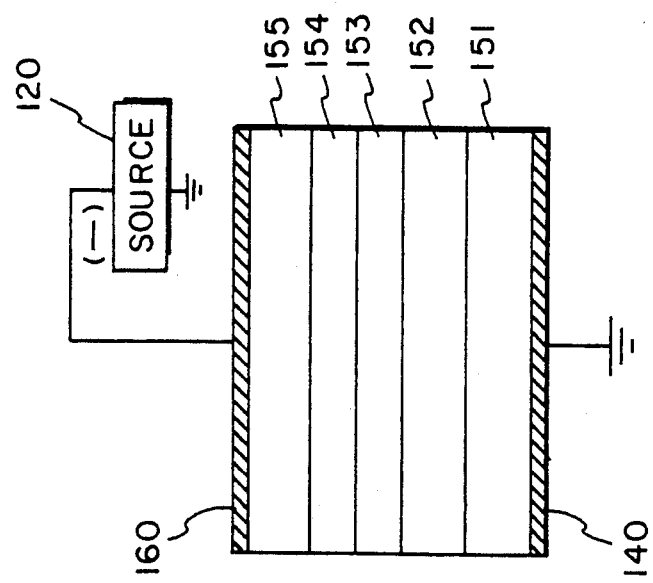

SEMICONDUCTOR DEVICE AND METHOD

This invention was made with Government support, and the Government has certain rights in this invention.

This is a continuation of U.S. application Ser. No. 927,554, filed Nov. 5, 1986 now abandoned.

BACKGROUND OF THE INVENTION

This invention relates to semiconductor devices and, more particularly, to a device and method for achieving a high speed operation semiconductor device for potential use in oscillators, mixers, logic circuits, radiation sensors, modulators, and other circuit applications.

In recent years high speed semiconductor devices have been developed, and the achievement of even faster devices is a widespread goal. The phenomena of so-called ballistic action, resonant tunneling, hot electron tunneling, and other mechanisms in real and/or theoretical high speed semiconductor devices, are described in the following publications: T. E. Bell, "The Quest For Ballistic Action", IEEE Spectrum, February, 1986; J. M. Poate et al., "Progress Toward A Metal-Base Transistor", IEEE Spectrum, February, 1985; L. F. Eastman, "Ballistic Electrons In Compound Semiconductors", IEEE Spectrum, February, 1986; M. I. Nathan et al., "A Gallium Arsenide Ballistic Transistor?", IEEE Spectrum, February, 1986; Y. Zohta, "Negative Resistance Of Semiconductor Heterojunction Diodes Owing To Transmission Resonance", J. Appl. Phys. 57(6), 1985; T. Sollner et al., "Resonant Tunneling Through Quantum Wells At Frequencies Up To 2.5 THz", Appl. Phys. Lett. 43(6), 1983; T. Sollner et al., "Quantum Well Oscillators", Appl. Phys. Lett. 45(12), 1984; S. W. Kirchoefer et al., "Negative Differential Resistance At 300K In A Superlattice Quantum State Transfer Device", Appl. Phys. Lett. 44(11), 1984; A. Kastalsky et al., "High Frequency Amplification And Generation In Charge Injection Devices", Appl. Phys. Lett. 48(1), January, 1986; M. Heiblum et al., "Tunneling Hot-Electron Transfer Amplifier: A Hot-Electron GaAs Device With Current Gain", Appl. Phys. Lett. 47 (10), 1985; J. R. Barker, "Quantum Theory Of Hot Electron Tunneling In Microstructures", Physika 134B, 1985; Hickmott et al., "Sequential Single-Phonon Emission In GaAs-Al$_x$Ga$_{1-x}$As Tunnel Junctions", Phys. Rev. Lett. 52(23), 1984.

In the last-listed publication, Hickmott et al., there is disclosed a structure which in which there is tunneling current from a heavily doped (n+) GaAs layer, through an Al$_x$Ga$_{1-x}$As layer into a lightly doped (n−) GaAs layer in magnetic fields large enough for magnetic freezeout to occur.

It is an object of the present invention to provide a novel device and method for obtaining high speed operation in a semiconductor structure.

SUMMARY OF THE INVENTION

In accordance with an embodiment of the invention, there is provided a semiconductor heterostructure device which includes a first semiconductor layer having a barrier layer disposed thereon, the barrier layer being formed of a semiconductor material having a wider bandgap than the material of the first semiconductor layer. A carrier transport layer is disposed on the barrier layer, the carrier transport layer being formed of a semiconductor material having a narrower bandgap than the material of the barrier layer. A contact layer is disposed on the carrier transport layer. Means are provided for applying a negative potential to the contact layer with respect to the first semiconductor layer.

In operation, for small voltages, under the indicated bias configuration, electrons supplied to the carrier transport layer by the source of negative potential supply will be blocked at the barrier presented by the larger bandgap barrier layer, and little current will flow. As the bias voltage is increased, these blocked electrons are under the influence of an increasing electric field which raises the electron energy. At some point, these "heated" electrons will suddenly have enough energy to cross the barrier and contribute to a larger current flow. A transition can occur between these two types of current flow, and the result is an S-shaped type of current-voltage characteristic, which can be utilized to obtain a very fast dual state device.

In an embodiment of the invention, the semiconductor material of the carrier transport layer is lightly doped (defined as N in the range $5 \times 10^{13}$ to $10^{16}$ carriers per cm$^{-3}$) gallium arsenide, and the barrier layer is formed of nominally-undoped aluminum gallium arsenide. The thickness of the carrier transport layer and the barrier layer are each preferably in the range 200 to 5000 Angstroms. In one implementation of this embodiment, the carrier transport layer and the barrier layer have about the same thickness, that is, a thickness of about two thousand Angstroms.

In accordance with a further embodiment of the invention, a multi-heterostructure device is provided which has a plurality of barrier-layer/transport-layer heterostructure regions, to obtain an enhanced effect in a series arrangement.

In a further embodiment of the invention, means are provided for controlling the current passing through the barrier layer, for example by providing a gate electrode coupled to the barrier layer, and means for applying a signal to the gate electrode so as to control carrier excursions through the barrier layer.

Further features and advantages of the invention will become more readily apparent from the following detailed description when taken in conjunction with the accompanying drawings.

BRIEF DESCRIPTION OF THE DRAWINGS

FIG. 1 is a cross sectional view, not to scale, of a device in accordance with the invention and which can be used for practicing the method of the invention.

FIG. 2 is a cross sectional view, not to scale, of a device which is a simplified version of the FIG. 1 device.

FIG. 3 shows band diagrams applicable to the FIG. 1 and FIG. 2 devices.

DESCRIPTION OF THE PREFERRED EMBODIMENT

Figure 4:
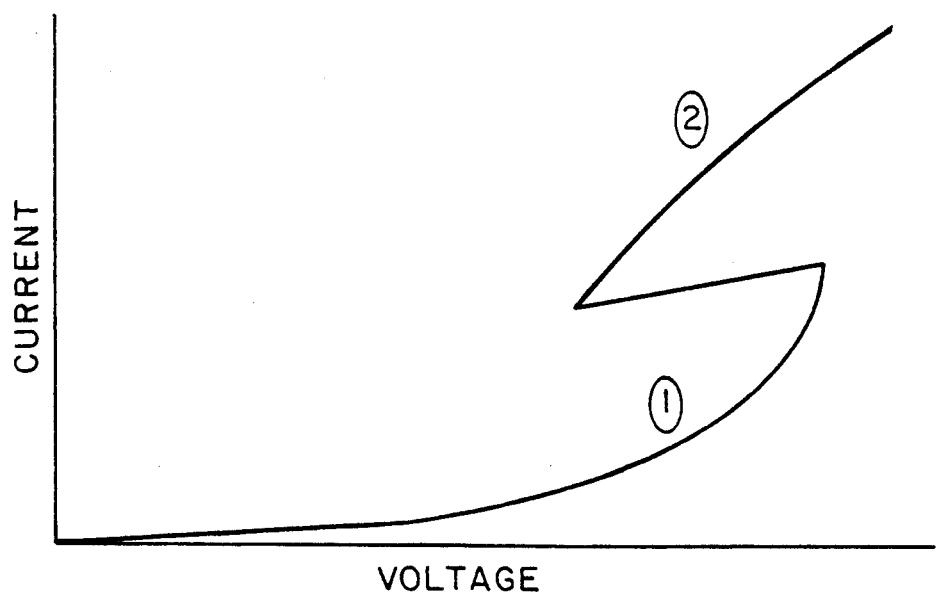
FIGS. 4 and 5 show an expected type of current-voltage characteristic.

Referring to FIG. 1, there is shown a cross-sectional view of a device in accordance with an embodiment of the invention. A conducting [100] oriented GaAs substrate 151 (Si, $2\times10^{18}$ cm$^{-3}$ in this embodiment) has the following layers grown thereon in the order shown: a 1um GaAs buffer layer 152 doped $2\times10^{18}$ cm$^{-3}$ with selenium, a 2000 Angstrom undoped Al$_{.45}$Ga$_{.55}$As barrier layer 153, a 2000 Angstrom nominally-undoped n-type GaAs carrier transport layer 154, and a conducting gallium arsenide cap layer 155. Metallic ohmic contacts 140 and 160, such as Au-Ge-Ag contacts, are applied on opposing ends, and a negative electrical potential is applied to contact 160 with respect to contact 140, as represented by the source of potential 120.

A simplified version of the FIG. 1 device is illustrated in FIG. 2, which shows a structure having the following elements corresponding to elements of like reference numerals in FIG. 1: contact 140, conducting layer 151 (or 152), nominally-undoped wider bandgap barrier layer 153, nominally-undoped (or lightly doped) carrier transport layer 154, and contact 160. In operation, for small voltages, under the indicated bias configuration, electrons supplied to the carrier transport layer 154 by the negative terminal of the power supply 120 will be blocked at the barrier presented by the larger bandgap barrier layer 153 and little current will flow. As the bias voltage is increased, these blocked electrons are under the influence of an increasing electric field which raises the electron energy. At some point, these "heated" electrons will suddenly have enough energy to cross the barrier 154 and contribute to a larger current flow.

Figure 5:
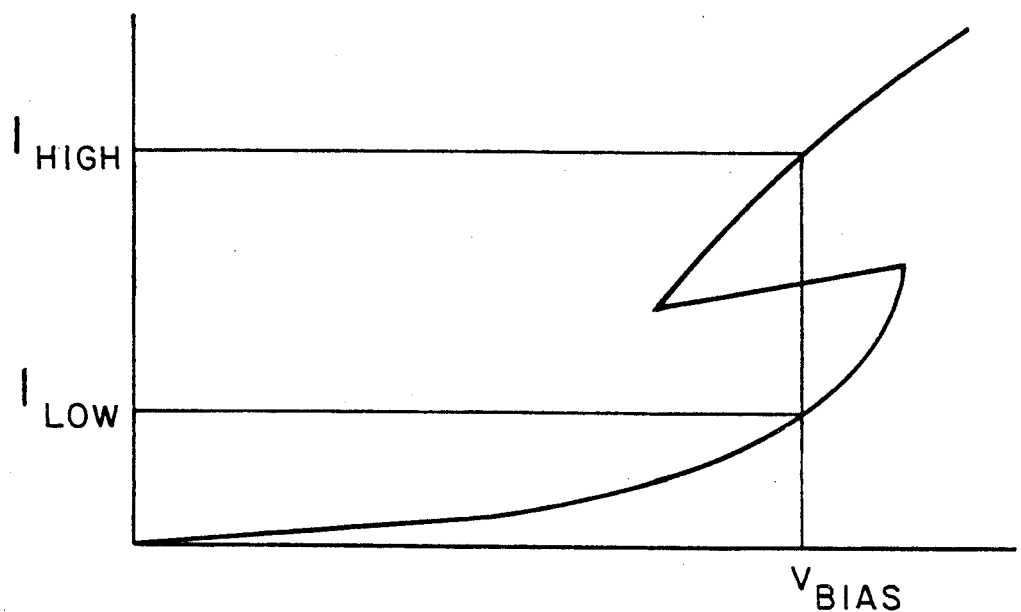

Consider the band diagrams of FIG. 3 which applies to the layers 154, 153 and 151 (FIG. 2 or FIG. 1). Electrons can propagate through the structure in one of two modes. For low electric fields in the lightly doped region 154, [diagram 3(a)], electrons will stay close to the conduction band minimum and drift toward the barrier resulting only in a small tunneling current through the barrier layer 153 (path 1). For higher electric fields in the lightly doped region 154 [diagram 3(b)], the electron gas will be heated and thermionic emission (or ballistic propagation, if the distances are short enough) over the barrier becomes dominant (path 2). These two current channels, tunneling and thermionic emission, will lead to two different types current-voltage characteristics which are shown schematically in FIG. 4, and labeled 1 and 2. A transition can occur between these current channels as the voltage drop in the carrier transport layer GaAs (154) increases and the heating of the electrons in the semiconductor becomes significant. The expected result of such a transition is an S-shaped current-voltage characteristic. As shown in the same shaped diagram in FIG. 5, the expected current-voltage characteristic first seen in FIG. 4 can be used to obtain a dual state device having, for a $V_{bias}$ somewhere in the S-shaped region, two possible values of current. The switching between states will be, in principle, extremely fast since its intrinsic speed is limited only by the electron transit time across the layers.

Experimental structures, in the form of FIG. 2, were grown by metalorganic chemical vapor deposition (MOCVD) at a temperature of 720° C. using trimethylgallium, trimethylaluminum, hydrogen selenide and arsine as sources. The growth rates were 7.1 Angstroms per second for GaAs and 12.3 Angstroms per second for Al$_{.45}$Ga$_{.55}$As. The Au-Ge-Ag contacts were defined by liftoff metalization followed by mesa definition and etch. The contacts were then alloyed at 410° C. for 10 seconds.

Figure 6:
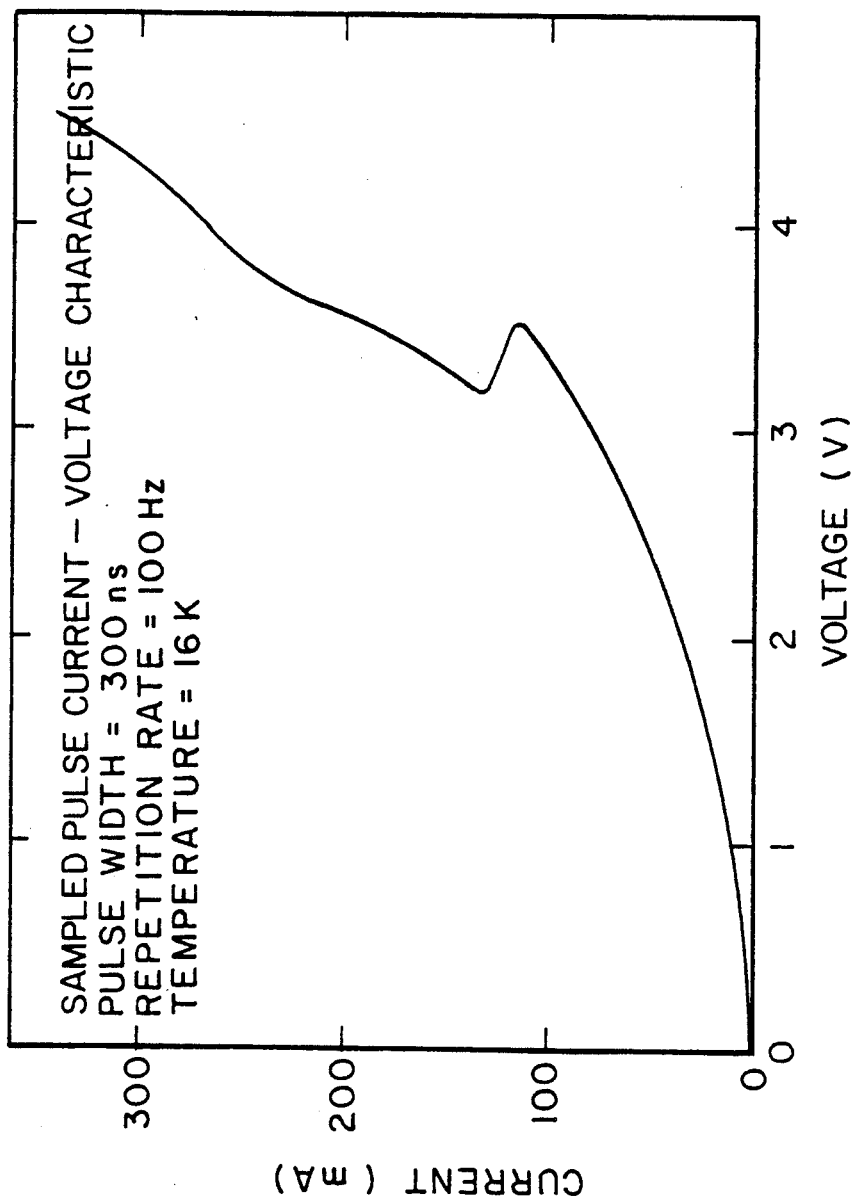
FIG. 6 shows the current-voltage characteristic of an experimental structure.

Device DC current-voltage characteristics were measured by low duty cycle sampled pulse techniques to eliminate lattice heating effects. FIG. 6 shows the 16° K. pulsed current-voltage characteristic for the described devices. The pulse width was 300 ns and the repetition rate was 100 Hz. Similar switching characteristics are observed at temperatures as high as 77° K., but the effect is greater at lower temperatures. Some light sensitivity was observed in the I-V characteristics under microscope lamp illumination in the form of a distinctly different threshold for switching. The overall shape and width of the "S" did not change with light intensity. As expected, the devices showed no switching behavior for reverse bias (negative voltage on the n+ side adjacent to the tunneling barrier).

Figure 7:
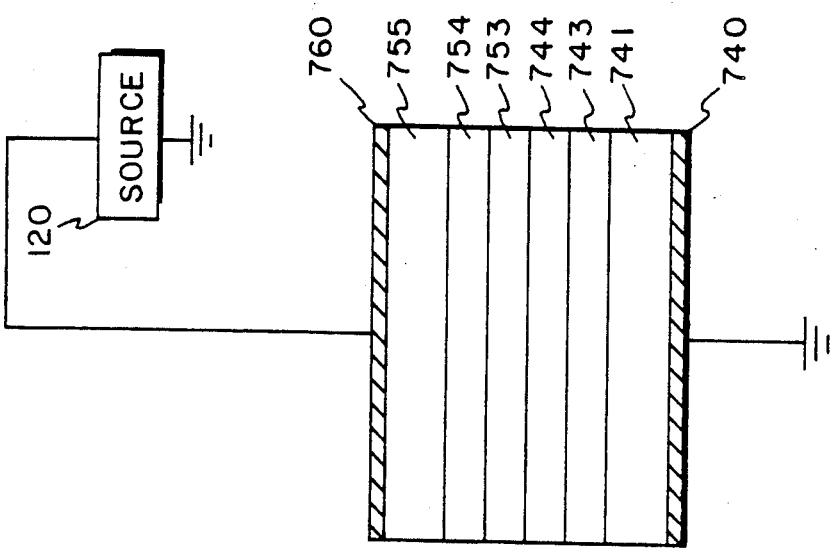
FIG. 7 shows a cross-sectional view, not to scale, of a further embodiment of the invention which includes additional layer groups that exhibit operation as described in conjunction with the devices of FIGS. 1 and 2.

It will be understood that two or more layer pairs of transport-layer/barrier-layer can be utilized in series, such as is shown in the embodiment of FIG. 7. In this embodiment, a gallium arsenide conducting substrate 741 has formed thereon an aluminum gallium arsenide barrier layer 743, a gallium arsenide carrier transport layer 744, these layers respectively corresponding to the layers 153 and 154 in FIG. 1 or FIG. 2. A group of two more layers, that is, barrier layer 753 and carrier transport layer 754, again respectively corresponding to the layers 153 and 154 of the FIG. 1, 2 embodiment, are then formed. A cap layer 755 is provided (corresponding to layer 155 of FIG. 1), and contact layers 740 and 760 are provided, as shown, as is a source of negative potential 120 which operates, as in the FIG. 1 embodiment, to apply a negative potential to the contact 760 with respect to the contact 740. Operation is like that described in conjunction with FIG. 1 and FIG. 2, except that the indicated characteristic occurs for each of the active regions comprising a carrier transport layer and a barrier layer, as previously described. When electrons leave the first barrier layer (e.g. 753 in FIG. 7), they are already "heated", and the effect in the second layer pair (744,743) can be enhanced. It will be understood that the layer compositions and thicknesses may be varied as desired, to obtain particular operating characteristics. Typically, but not necessarily, thinner layers are used than in the device with a single transport-layer/barrier-layer pair.

Figure 8:
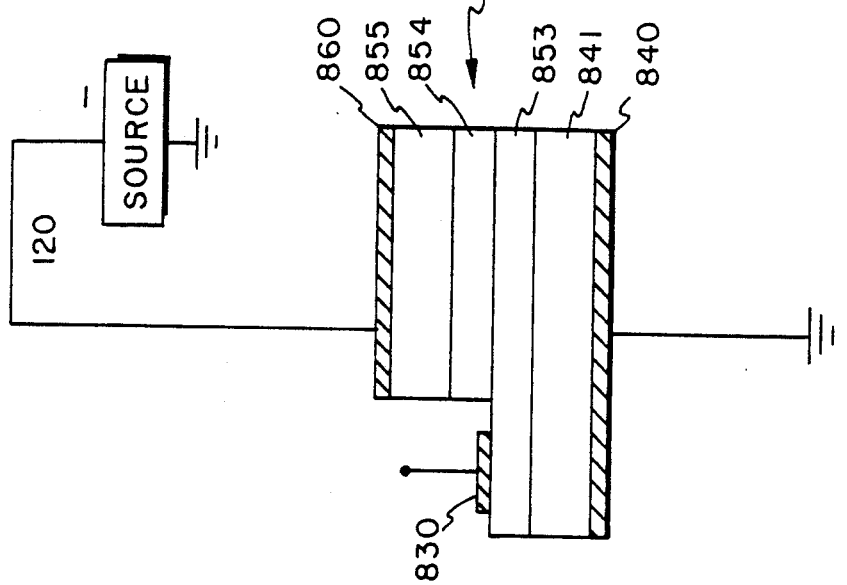

Referring to FIG. 8, there is shown a further embodiment of the invention wherein a means is provided for controlling the carriers in the barrier layer. In FIG. 8, this is done with a 3 terminal device, the third terminal being coupled to a gate electrode 830 that is applied to a barrier layer 853. In the FIG. 8 embodiment, the layer 841 is a gallium arsenide conducting substrate (corresponding to layer 151 in FIG. 1), the layer 853 is an aluminum gallium arsenide barrier layer (corresponding to layer 153 in FIG. 1), the layer 854 is a gallium arsenide carrier transport layer (corresponding to layer 154 in FIG. 1), and the layer 855 is a gallium arsenide cap layer (corresponding to layer 155 in FIG. 1). [No layer is shown corresponding to the gallium arsenide buffer layer 152 of FIG. 1, although one can be provided, if desired.] Metal contacts 840 and 860, and a source of potential 120 are provided, as before. In this case, a signal can be applied to the gate 830 to control the switching of the device. The signal can be selected to either effectively raise or lower the barrier, to affect the switching status in a desired manner.

In FIG. 8 a source of radiation, represented by reference numeral 895, is illustrated as an alternative means of affecting carriers in the barrier layer. A controlled source of optical radiation could be used in this fashion, or the device can be used to detect radiation by having it operate near the potential at which it would switch in the absence of radiation, and then sensing radiation which causes the device to switch. Again, a very fast mode of operation would be expected.

Figure 9:
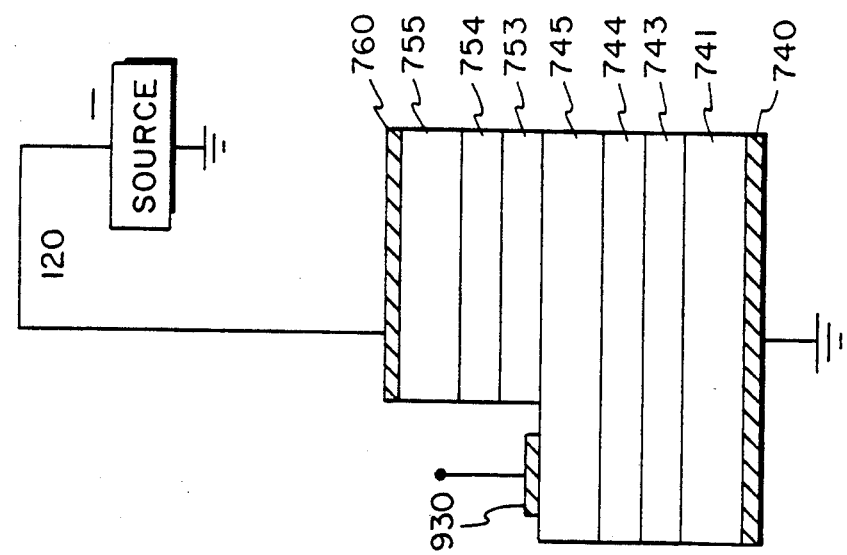
FIGS. 8 and 9 illustrate embodiments of the invention, not to scale, wherein a third electrode is utilized to control the excursion of carriers through the barrier layer of the device.

In FIG. 9 there is shown another embodiment of a three terminal device. In this embodiment, the layered structure (741, 743, 744, 753, 754 and 755) and the contacts 740 and 760 correspond to the structure of like reference numerals in FIG. 7. In the FIG. 9 embodiment, a gate 930 is applied to an intermediate heavily doped gallium arsenide layer 745. Application of a control signal to the gate 930 will affect the potential across the carrier transport layers and barrier layers, and therefore control the switching of the device.

In the devices hereof, the wider gap barrier layer can be replaced by a graded energy gap layer. The grading can be accomplished by grading the composition and this can be done linearly, in a stepped fashion, or with any arbitrary energy gap (composition) profile.

The invention has been described with reference to particular preferred embodiments, but variations within the spirit and scope of the invention will occur to those skilled in the art. For example, it will be understood that additional buffer layers can be provided, as desired, in the various embodiments, and that other means of providing contact to the defined structures can be utilized.

We claim:

1. A semiconductor heterostructure device, comprising:
   a first conductive semiconductor layer of one conductivity type;
   a barrier layer disposed on said first semiconductor layer, said barrier layer having a thickness in the range between about 200 and 5000 Angstroms and being formed of an undoped semiconductor material having a wider bandgap than the material of said first semiconductor layer;
   a carrier transport layer having a thickness in the range between about 200 and 5000 Angstroms, disposed on said barrier layer, said carrier transport layer being formed of a semiconductor material having a narrower bandgap than the material of said barrier layer and a carrier concentration in the range $5 \times 10^{13}$ to $10^{16}$ carriers per cubic centimeter;
   a semiconductor contact layer, of said one conductivity type, disposed on said carrier transport layer; and
   means for applying a negative potential to said semiconductor contact layer with respect to said first semiconductor layer;
   whereby, as said negative potential is increased, the increased field in the carrier transport layer will result in heated electrons in the carrier transport layer which cross over the barrier.

2. The device as defined by claim 1, wherein said barrier layer is formed of aluminum gallium arsenide, and said carrier transport layer is formed of gallium arsenide.

3. The device as defined by claim 1, wherein said barrier layer is formed of aluminum gallium arsenide, and said carrier transport layer, said first semiconductor layer, and said contact layer are formed of gallium arsenide.

4. The device as defined by claim 1, wherein said barrier layer and said carrier transport layer have about the same thickness.

5. The device as defined by claim 3, wherein said barrier layer and said carrier transport layer have about the same thickness.

6. The device as defined by claim 5, wherein said thickness is about 2000 Angstroms.

7. The device as defined by claim 1, further comprising means for controlling the current passing through said barrier layer.

8. The device as defined by claim 3, further comprising means for controlling the current passing through said barrier layer.

9. The device as defined by claim 7, wherein said controlling means comprises a gate electrode coupled to said barrier layer, and means for applying a signal to said gate electrode.

10. The device as defined by claim 8, wherein said controlling means comprises a gate electrode coupled to said barrier layer, and means for applying a signal to said gate electrode.

11. The device as defined by claim 7, wherein said controlling means comprises radiation applied to said device.

12. The device as defined by claim 8, wherein said controlling means comprises radiation applied to said device.

13. The device as defined by claim 1, further comprising one or more additional groups of barrier layer and carrier transport layer, as defined in said claim 1, disposed between said first-mentioned carrier transport layer and said contact layer.

14. The device as defined by claim 3, further comprising one or more additional groups of barrier layer and carrier transport layer, as defined in said claim 3, disposed between said first-mentioned carrier transport layer and said contact layer.

15. A semiconductor heterostructure device, comprising:
   a first conductive semiconductor layer of one conductivity type;
   a first barrier layer disposed on said first semiconductor layer, said first barrier layer having a thickness in the range between about 200 and 5000 Angstroms and being formed of an undoped semiconductor material having a wider bandgap than the material of said first semiconductor layer;
   a first carrier transport layer having a thickness in the range between about 200 and 5000 Angstroms, disposed on said first barrier layer, said first carrier transport layer being formed of a semiconductor material having a narrower bandgap than the material of said first barrier layer and a carrier concentration in the range $5 \times 10^{13}$ to $10^{16}$ carriers per cubic centimeter;
   a second barrier layer disposed on said first carrier transport layer, said second barrier layer having a thickness in the range between about 200 and 5000 Angstroms and being formed of an undoped semiconductor material having a wider bandgap than the material of said first semiconductor layer;
   a second carrier transport layer having a thickness in the range between about 200 and 5000 Angstroms, disposed on said second barrier layer, said second carrier transport layer being formed of a semiconductor material having a narrower bandgap than the material of said second barrier layer and a carrier concentration in the range $5 \times 10^{13}$ to $10^{16}$ carriers per cubic centimeter;

a semiconductor contact layer, of said one conductivity type, coupled to said second carrier transport layer; and means for applying a negative potential to said semiconductor contact layer with respect to said first semiconductor layer.

16. The device as defined by claim 15, wherein said barrier layers are formed of aluminum gallium arsenide, and said carrier transport layers, said first semiconductor layer, and said semiconductor contact layer are formed of gallium arsenide.

17. The device as defined by claim 2, wherein said first semiconductor layer and said semiconductor contact layer are both n-type.

18. A semiconductor heterostructure device, comprising:

a first conductive semiconductor layer;

a barrier layer disposed on said first semiconductor layer, said barrier layer having a thickness in the range between about 200 and 5000 Angstroms and being formed of an undoped semiconductor material having a wider bandgap than the material of said first semiconductor layer;

a carrier transport layer having a thickness in the range between about 200 and 5000 Angstroms disposed on said barrier layer, said carrier transport layer being formed of a semiconductor material having a narrower bandgap than the material of said barrier layer and a carrier concentration in the range $5 \times 10^{13}$ to $10^{16}$ carriers per cubic centimeter;

a metallic ohmic contact layer disposed on said carrier transport layer; and means for applying a negative potential to said contact layer with respect to said first semiconductor layer;

whereby, as said negative potential is increased, the increased field in the carrier transport layer will result in heated electrons in the carrier transport layer which cross over the barrier.

19. The device as defined by claim 18, wherein said barrier layer is formed of aluminum gallium arsenide, and said carrier transport layer is formed of gallium arsenide.

20. The device as defined by claim 19, wherein said first semiconductor layer is formed of gallium arsenide.

21. The device as defined by claim 18, wherein said barrier layer and said carrier transport layer have about the same thickness.

22. The device as defined by claim 20, wherein said barrier layer and said carrier transport layer have about the same thickness.

23. The device as defined by claim 18, further comprising means for controlling the current passing through said barrier layer.

24. The device as defined by claim 18, further comprising one or more additional groups of barrier layer and carrier transport layer, as defined in said claim 18, disposed between said first-mentioned carrier transport layer and said contact layer.

25. The device as defined by claim 1, further comprising a semiconductor cap layer of said one conductivity type disposed on said first conductive semiconductor layer, said negative potential being applied to said cap layer with respect to said first semiconductor layer.

26. The device as defined by claim 25, wherein said barrier layer is formed of aluminum gallium arsenide, and said carrier transport layer, said contact layer, said first semiconductor layer, and said cap layer are formed of gallium arsenide.

27. The device as defined by claim 26, wherein said first semiconductor layer, said cap layer, and said contact layer are all n-type.

* * * * *